United States Patent
Kondo

(10) Patent No.: US 6,735,644 B2
(45) Date of Patent: May 11, 2004

(54) DATA PROCESSOR AND DATA PROCESSING METHOD

(75) Inventor: Hiroyasu Kondo, Kanagawa (JP)

(73) Assignee: Ando Electric Co., Ltd., Kawasaki (JP)

(*) Notice: Subject to any disclaimer, the term of this patent is extended or adjusted under 35 U.S.C. 154(b) by 541 days.

(21) Appl. No.: 09/813,677

(22) Filed: Mar. 21, 2001

(65) Prior Publication Data

US 2001/0040894 A1 Nov. 15, 2001

(30) Foreign Application Priority Data

Mar. 24, 2000 (JP) .................................. P. 2000-084479

(51) Int. Cl.[7] .............................. G06F 3/00; H04I 3/06
(52) U.S. Cl. ...................... 710/30; 710/71; 370/465; 370/474
(58) Field of Search .................... 710/71, 62, 30; 370/465, 539, 513, 474

(56) References Cited

U.S. PATENT DOCUMENTS

| | | | | |
|---|---|---|---|---|
| 4,920,535 A | * | 4/1990 | Watanabe et al. | 370/512 |
| 5,701,299 A | * | 12/1997 | Umezu | 370/376 |
| 5,710,774 A | * | 1/1998 | Suh et al. | 370/513 |
| 5,784,380 A | * | 7/1998 | Kuwahara | 370/509 |
| 5,862,143 A | * | 1/1999 | Suh | 370/513 |
| 6,385,213 B1 | * | 5/2002 | Nakamura et al. | 370/513 |

* cited by examiner

*Primary Examiner*—Kim Huynh
(74) *Attorney, Agent, or Firm*—Fish & Richardson P.C.

(57) ABSTRACT

A data processor 1 converts serial data in an STM-16 to parallel data that is based on eight bytes (64 bits). A transparent information detector 10 detects the position of the data (transparent data) as a candidate for transparent processing in the parallel data and transparent processors 30a through 30e serially connected in five stages converts the transparent data and rearranges the processed data based on the detected information. Thus, the data processor 1 can perform transparent processing easily via a relatively low-speed general-purpose device, by converting high-speed serial data in the STM-16 to every 8-byte parallel data for further processing.

8 Claims, 4 Drawing Sheets

DATA PROCESSOR AND DATA PROCESSING METHOD

BACKGROUND OF THE INVENTION

1. Field of the Invention

The present invention relates to data processing apparatus and a data processing method used for high-speed serial communications.

2. Description of the Related Art

One of the global standards for realizing high-speed data communications is the SDH (Synchronous Digital Hierarchy). The SDH specifies the synchronous transfer mode called STM (Synchronous Transfer Mode). The bit rate of the corresponding module STM-1 (Synchronous Transport Module Level One) is 155.52 Mb/s.

The frame structure of the STM-1 is composed of a byte matrix of nine rows by 270 columns. The leading section of nine rows by one column is called the section overhead (hereinafter referred to as the SOH). The subsequent section of nine rows by nine columns is called the payload. The SOH is a management section having frame synchronization signals and maintenance information appended to the payload. The payload accommodates multiplexed real data.

In the STM, one frame is transmitted in 125 microseconds. Bit rate depends on the number of bytes corresponding to the data of one row by one column. For example, in the STM-1, data of one row by one column is one-byte data thus nine rows×270 bytes×(1/125 microseconds)=155.52. The bite rate is 155.52 Mbps. The SDH specifies standardized modules such as the STM-4 having a bit rate four times as large as that of the STM-1, with the data of one row by one column being four bytes, and the STM-16 having a bit rate 16 times as large as that of the STM-1, with the data of one row by one column being 16 bytes.

The STM divides one frame into a plurality of time slots (channels) and multiplexes a plurality of data pieces by storing in each time slot original data such as user data that is transmitted/received. Such multiplexed data is transmitted as serial data via the SDH transmission network.

In the data transmitted via the SDH transmission network is inserted predetermined data (idle data) in order to delimit data in the STM. In order to distinguish original data having the sane code as idle data, predetermined data conversion is performed. Thus, it is necessary for the receiving party to perform transparent processing for restoring data converted by the sending party.

The transparent processing is a processing whereby received serial data is sequentially converted to parallel data every eight bits and predetermined data (transparent data) converted at the sending party is converted (restored) to original data at the receiving party of the SDH transmission network.

FIG. 4 is a schematic diagram of the transparent processing according to the related art.

In FIG. 4, received serial data is input to a transparent data detector 110 of a data processor 100. The transparent data detector detects information on the transparent data in the received data such as the position of the transparent data and sends the received data and detected information to a transparent data converter 120. The transparent data converter 120 converts the transparent data in the received data to the predetermined original data based on the detected information received.

In recent years, high-speed data communications based on the STM-16 are in use with the expansion of communication data.

In the STM-16, parallel conversion on a per eight bits basis requires processing at 311 Mbps (8-bit parallel data processing).

The processing speed of a device used for transparent processing cannot reach 311 Mbps (8-bit parallel data processing).

SUMMARY OF THE INVENTION

An object of the invention is to easily realize the transparent processing on high-speed serial data that is based on the STM.

To achieve the above object, according to a first aspect of the invention, there is provided a data processor used for high-speed serial data communications, comprising:

a data converter (for example an interface provided in a transparent information detector 10 in FIG. 1) for receiving high-speed serial data and converting the data to parallel data of predetermined data width;

a transparent data information detector (for example, a transparent information detector 10 in FIG. 1) for detecting information on transparent data from the parallel data converted by the data converter;

a data movement controller (for example a pointer controller in FIG. 1) for calculating the quantity of data to be moved from parallel data in the subsequent stage based on the transparent data information, the quantity of data decreased by conversion of the transparent data; and a transparent processor (for example transparent processors 30a–30e) for converting transparent data in the parallel data based on the transparent data information and the quantity of data to be moved, moving predetermined data from parallel data in the subsequent stage, and rearranging the moved data into parallel data of predetermined width.

According to the first aspect of the invention, in the data processor used for high-speed serial data communications, the data converter receives high-speed serial data and converts the data to parallel data of predetermined data width, the transparent data information detector detects information on transparent data from the parallel data converted by the data converter, the data movement controller calculates the quantity of data to be moved from parallel data in the subsequent stage based on the transparent data information, the quantity of data decreased by conversion of the transparent data, and the transparent processor converts transparent data in the parallel data based on the transparent data information and the quantity of data to be moved, moves predetermined data from parallel data in the subsequent stage, and rearranges the moved data into parallel data of predetermined width.

According to a fifth aspect of the invention, there is provided a data processing method for data associated with high-speed serial communications, comprising:

a data converting step for receiving high-speed serial data and converting the data to parallel data of predetermined data width;

a transparent data information detecting step for detecting information on transparent data from the parallel data converted by the data converter;

a data calculating step for calculating the quantity of data to be moved from parallel data in the subsequent stage based on the transparent data information, the quantity of data decreased by conversion of the transparent data; and a transparent processing step for converting transparent data in the parallel data based on the transparent data information and the quantity of data to be moved, moving predetermined data from parallel data in the subsequent stage, and rearranging the moved data into parallel data of predetermined width.

Thus, received serial data can be converted to parallel data and processed based on the detected transparent data information according to the first and fifth aspects of the invention. This allows high-speed serial data to be applied transparent processing via a relatively low-speed device. It is possible to flexibly support serial data of a variety of data speeds by changing as required the data width of parallel data to be converted depending on the speed of the received serial data.

According to a second aspect of the invention, there is provided a data processor according to the first aspect of the invention, wherein the transparent data information detector comprises:

a transparent data detector (for example, a transparent data detector 11 in FIG. 1) for detecting the position of transparent data contained in the parallel data converted by the data converter; and a transparent information sender (for example a transparent information sender 12 in FIG. 1) for sending the position of transparent data detected by the transparent data detector to the data movement controller and the transparent processor as the transparent data information.

According to the second aspect of the invention, in a data processor according to the first aspect of the invention, in the transparent data information detector, the transparent data detector detects the position of transparent data contained in the parallel data converted by the data converter and the transparent information sender sends the position of transparent data detected by the transparent data detector to the data movement controller and the transparent processor as the transparent data information.

According to a sixth aspect of the invention, there is provided a data processing method according to the fifth aspect of the invention, wherein the detecting step comprises:

a step for detecting the position of transparent data contained in the converted parallel data and a step for sending the position of the detected transparent data as the transparent data information.

Thus, the position of transparent data contained in the converted parallel data is detected according to the second and the sixth aspects of the invention. It is possible to calculate the quantity of data to be moved in the movement controller and to convert the transparent data in the transparent processor.

According to a third aspect of the invention, there is provided a data processor according to the first aspect of the invention, wherein the transparent processor comprises: a plurality of unit transparent processors (for example transparent processors 30a–30e) each of which converts one of the transparent data pieces contained in the parallel data single block to original data and moves predetermined data from the parallel data in the subsequent stage based on the quantity of data to be moved, and rearranges the moved data into parallel data of predetermined width.

According to the third aspect of the invention, in a data processor according to the first aspect of the invention, each of a plurality of unit transparent processors provided in the transparent processor converts one of the transparent data pieces contained in the parallel data single block to original data and moves predetermined data from the parallel data in the subsequent stage based on the quantity of data to be moved, and rearranges the moved data into parallel data of predetermined width.

According to a seventh aspect of the invention, there is provided a data processing method according to the fifth aspect of the invention, wherein the transparent processing step comprises a plurality of unit transparent processing steps each of which converts one of the transparent data pieces contained in the parallel data single block to original data and moves predetermined data from the parallel data in the subsequent stage based on the quantity of data to be moved, and rearranges the moved data into parallel data of predetermined width.

Thus, all the transparent data can be easily processed by repeating the same processing (unit transparent processing) depending on the data width of parallel data according to the third and seventh aspect of the invention.

According to a fourth aspect of the invention, there is provided a data processor according to the third aspect of the invention, wherein the unit transparent processor comprises: a transparent data converter (for example transparent data converters 31a–31e in FIG. 1) for converting transparent data contained in the parallel data to original data and a data movement section (for example data switch sections 32a–32e in FIG. 1) for moving predetermined data from the parallel data in the subsequent stage based on the quantity of data to be moved, and rearranges the moved data into parallel data of predetermined width.

According to the fourth aspect of the invention, in a data processor according to the third aspect of the invention, a transparent data converter provided in the transparent processor converts transparent data contained in the parallel data to original data and a data movement section provided in the transparent processor moves predetermined data from the data in the subsequent stage to the parallel data to which transparent data is converted, based on the quantity of data to be moved calculated by the data movement controller.

According to an eighth aspect of the invention, there is provided a data processing method according to the seventh aspect of the invention, wherein the unit processing step comprises:

a step for converting transparent data contained in the parallel data to original data; and a step for moving predetermined data from the data in the subsequent stage to the parallel data to which transparent data is converted, based on the calculated quantity of data to be moved.

Thus, it is possible to realize a unit transparent processing via a simple processing according to the fourth and eighth aspects of the invention, thereby improving the efficiency of transparent processing.

BRIEF DESCRIPTION OF THE DRAWINGS

FIG. 2 shows an example of processing on parallel data in the transparent processor 30a;

DETAILED DESCRIPTION OF THE PREFERRED EMBODIMENTS

An embodiment of the invention will be detailed with reference to drawings.

Figure 1:
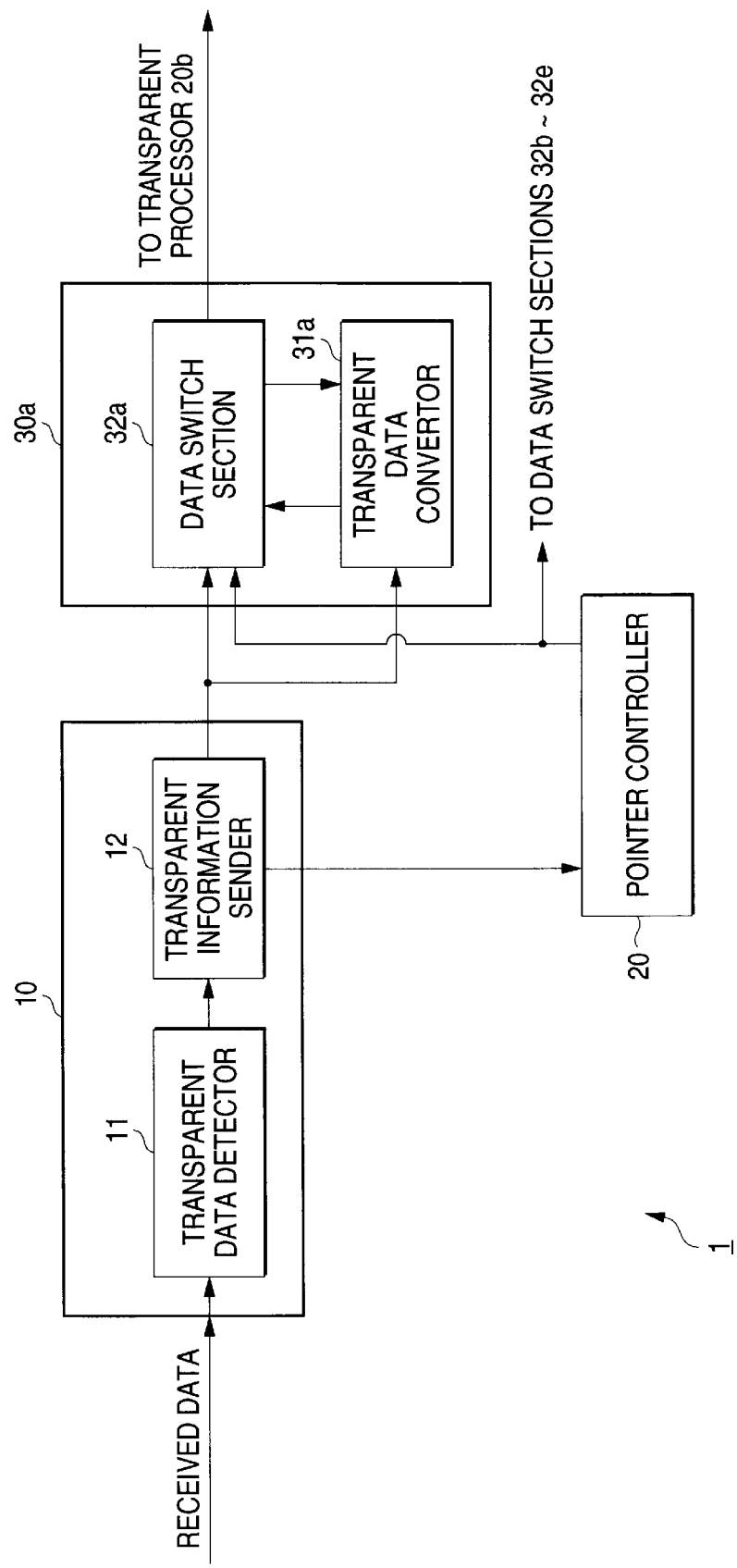
FIG. 1 is a schematic diagram showing the internal configuration of the data processor 1 to which the invention is applied.
Figure 2:
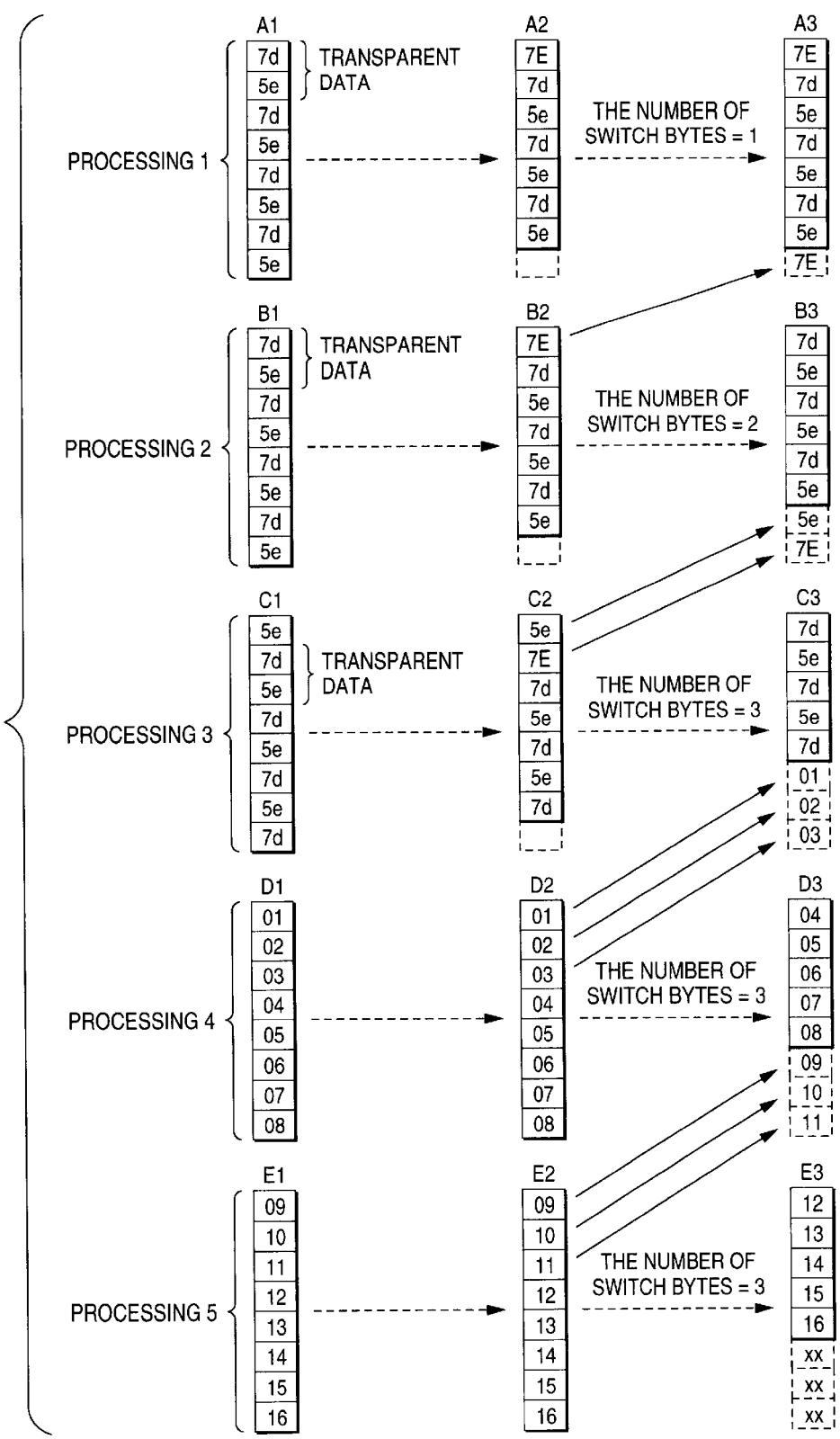
Figure 3:
FIG. 3 shows input data of the transparent processor 30a and output data of the transparent processor 30e.
Figure 4:
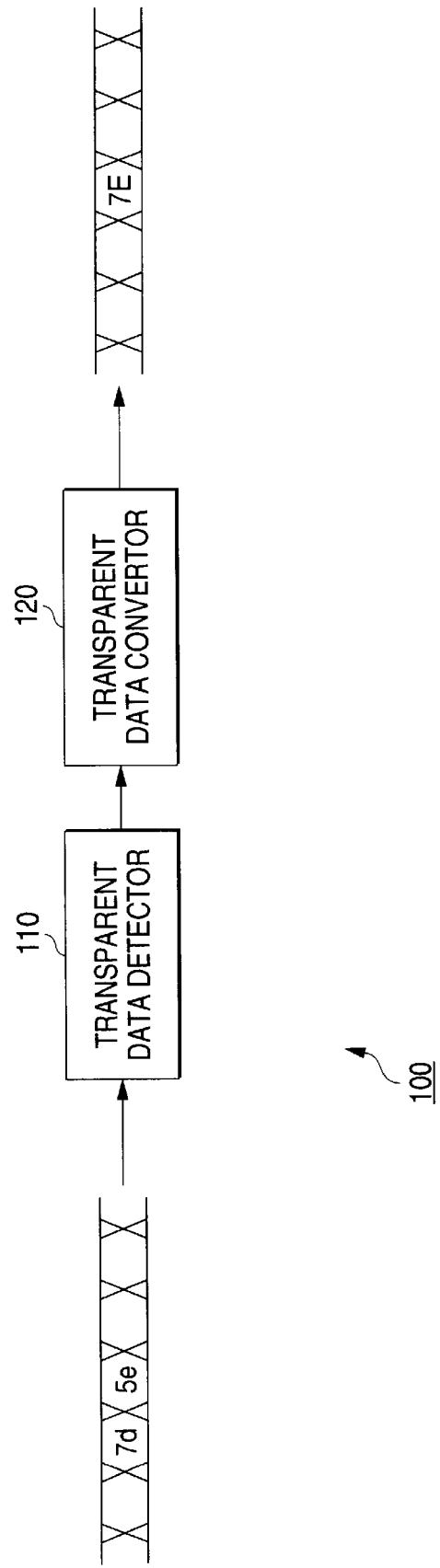
FIG. 4 is a schematic diagram of the transparent processing according to the related art.

FIGS. 1 to 3 show an embodiment of the data processor 1 to which the invention is applied.

The data processor 1 converts the serial data in the STM-16 to parallel data that is based on eight bytes (64 bits). The transparent information detector 10 detects the position of the data (transparent data) as a candidate for transparent processing in the parallel data and the transparent processors 30a through 30e serially connected in five stages converts the transparent data and rearranges the processed data based on the detected information. Thus, the data processor 1 can perform transparent processing easily via a relatively low-speed general-purpose device, by converting high-speed serial data in the STM-16 to every 8-byte parallel data for further processing.

First, the configuration of the embodiment will be described.

FIG. 1 is a schematic diagram showing the internal configuration of the data processor 1 to which the invention is applied. In FIG. 1, the data processor 1 is composed of a transparent information detector 10, a pointer controller 20 and transparent processors 30a through 30e.

The transparent information detector 10 is further composed of a transparent data detector 11 and a transparent information sender. The transparent information detector 10 is equipped with an interface (I/F) (not shown) at its input and converts serial data to every 8-byte parallel data (hereinafter the unit of this piece of parallel data is called a block) and sends the resulting data to a transparent data detector 11.

The transparent data detector 11 detects transparent data from parallel data sent from the I/F, i.e., from all the combinations of 2-byte data adjacent before the data is converted to parallel data, or as serial data. The transparent data detector 11 sends the detected information such as in which byte of which block the transparent data is positioned together with the received parallel data to a transparent information sender 12. The transparent data refers to data converted to predetermined data at the sending party in order to distinguish the original data having the same idle code as that of the idle data.

The transparent information sender 12 sends the detected information sent from the transparent data detector 11 to a pointer controller 20, a transparent data converter 31a and a data switch section 32a in a transparent processor 30a that will be described later. The transparent information sender 12 sends the parallel data sent from the transparent data detector 11 to the transparent data converter 31a.

The pointer controller 20 calculates the number of bytes to switch (move) from the subsequent block to the preceding block (hereinafter referred to as number of switch bytes) via the data switch sections 32a through 32e, based on the detected information sent from the transparent information sender 12. The pointer controller 20 then sends a data switch signal indicating the calculated number of switch bytes for each block to the data switch sections 32a through 32e.

The transparent processor 30a is composed of a transparent data converter 31a and a data switch section 32a.

The transparent data converter 31a, on receiving parallel data and detected information from the transparent information sender 12, latches parallel data on a per one block basis. The transparent data converter 31a then performs necessary data conversion based on the received detected information. That is, in case transparent data is present in a single block of parallel data, the transparent data converter 31a converts the transparent data positioned at the head address of the block indicated by the detected information to predetermined original data.

The transparent data converter 31a skips data conversion on a block of a received parallel data in case the block does not contain transparent data.

The transparent data converter 31a, on instruction for switching predetermined data from the data switch section 32a, switches the data of predetermined number of bytes (data of number of switch bytes indicated in the data switch signal from the head of the subsequent block to the data switch section 32a.

Next, the transparent data converter 31a sends the subsequent block to the data switch section 32a according to the instruction from the data switch section 32a.

The data switch section 32a latches a block of parallel data sent from the transparent data converter 31a. The data switch section 32a instructs the transparent data converter 31a to switch data of number of switch bytes, based on the data switch signal sent from the pointer controller 20. The data switch section 32a appends the predetermined data switched from the transparent data converter 31a to the latched block, rearranges the block into 8-byte parallel data, and sends the data to the transparent data converter 31b of the transparent processor 30b in the subsequent stage.

Thus, the data smaller than 8 bytes in a block latched by the data switch section 32 is switched from the head address of the subsequent block and sent as 8-byte parallel data.

The data switch section 32a sends the detected information sent from the transparent information sender 12 to a transparent data converter 31b and a data switch section 32b in a transparent processor 30b in the subsequent stage.

Similarly, transparent processors 30b through 30e convert transparent data to original data based on parallel data and detected information sent from a transparent processor in the preceding stage and data switch information sent from the pointer controller 20, and switch the data then rearrange the data and send the resulting predetermined data.

Next, the operation of the embodiment will be described.

The data processor, on receiving data that is based on the STM, extracts data other than idle data in the I/F of the transparent information detector 10 and converts the data to 8-byte parallel data.

Then, the transparent data detector 11 detects in which byte of which block of the converted parallel data the transparent data is positioned and sends the detected information and received parallel data to the transparent information sender 12.

Next, the transparent information sender 12 sends the detected information to the pointer controller 20, transparent data converter 31a and data switch section 32a, and sends the parallel data to the transparent data converter 31a.

The pointer controller 20 calculates the number of switch bytes in each block of the transparent processors 30a through 30e and sends a data switch signal to the data switch sections 32a through 32e of the transparent processors 30a through 30e.

An exemplary description of number of switch bytes will be given.

For simplicity, the transparent processor 30a is taken as an example.

In case the parallel data block latched by the transparent data converter 31a contains a transparent code and the data is converted, the block is reduced by one block. Thus it is necessary to switch lost data from the subsequent block, and further, data switching is required in all the subsequent blocks.

Each block is latched by the data switch section 32a. When data switching is made, the number of switch bytes corresponding to each block is sent to the data switch section 32a. That is, in the case of a block where transparent data is not converted, the number of switch bytes is sent as it is by the pointer controller 20. In the case of a block where transparent data is converted, the number of switch bytes plus 1 is sent as the number of switch bytes (see FIG. 2). Thus, when the data switch section 32a instructs the transparent data converter 31a to switch data, a proper number of switch bytes for each block is always sent. In case the number of switch bytes is "8", the block has no data and skipped, and the number of switch bytes is reset to the initial value "0".

When parallel data and detected information are sent from the transparent information sender 12, the transparent data converter 31a converts (restores) the transparent data positioned at the head address of the parallel data block to original data based on the detected information and sends the processing results (data-converted block) to the data switch section 32a.

The data switch section 32a latches the block sent from the transparent data converter 31a. The data switch section 32a instructs the transparent data converter 31a to switch data of number of switch bytes, based on the data-switch signal.

Next, the transparent data converter 31a switches the instructed data to the data switch section 32a. The data switch section 32a appends the data switched by the transparent data converter 31a to the latched block and rearranges the block into 8-byte parallel data. The data switch section 32a sends the block to the transparent data converter 31b of the transparent processor 30b in the subsequent stage as well as sends the detected information sent from the transparent information sender 12 to the transparent data converter 31b and the data switch section 32b.

Subsequently, each transparent processor repeats the similar processing as the transparent processor 30a to convert all the transparent data in parallel data to original data.

Here, referring to FIGS. 2 and 3, a case where a parallel data block containing transparent data is converted to original data. The portion "XX" in the parallel data in FIGS. 2 and 3 indicates invalid data.

FIG. 2 shows an example of processing on parallel data in the transparent processor 30a. FIG. 3 shows input data (blocks A1 through E1) of the transparent processor 30a and output data (blocks A4 through E4) of the transparent processor 30e.

In FIG. 2, blocks A1 through E1 are an example of the first to fifth data blocks to be input to the transparent processor 30a. The blocks A2 through E2 include data obtained by data converting the blocks A1 through E1 via the transparent data converter 31a. The blocks A3 through E3 include data to be sent to the transparent processor 30b by the transparent processor 30a.

In FIG. 2, processing 1 through 5 shows the processing on the first through fifth data blocks in the transparent processor 30a.

In the processing 1, first, transparent data present at the head address and the second address of block A1 ("7d" at the first byte and "5e" at the second byte) is converted to original data ("7E") and becomes 7-byte parallel data (block A2).

Then the block A2 is sent to the data switch section 32a.

The data switch section 32a instructs the transparent data converter 31a to switch data of number of switch bytes, based on the data switch signal. The transparent data converter 31a switches the data based on this instruction.

At this time, the transparent data converter 31a switches the data of instructed predetermined number of bytes ("7E" in the first byte) to the data switch section 32a, from the head address of the block B2 where predetermined transparent data has been converted.

Next, the data switch section 32a appends the data of predetermined number of bytes ("27E") switched from the transparent data converter 31a to the latched block A2 to obtain 8-byte parallel data (block A3). The data switch section 32a sends the block A3 to the transparent data converter 31b of the transparent processor 30b.

Then, the block B2 latched by the transparent data converter 31a and with transparent data converted is sent to the data switch section 32a. The head data ("7E") of the block B2 is switched to the block A3 thus the block B2 is 6 bytes long.

Same as the block A2, the data switch section 32a instructs the transparent data converter 31a to switch data of number of switch bytes ("5e" in the first byte of block C2 and "7d" in the second byte), based on the data switch signal. The transparent data converter 31a switches the data based on this instruction.

The data switch section 32a appends the data of predetermined number of bytes switched from the transparent data converted 31a ("5e" and "7d") to the block B2 and sends the resulting data to the transparent data converter 31b of the transparent processor 30b as 8-byte parallel data.

Subsequently, the same processing (processing 3 through 5) is repeated. The transparent processor 30a sends the blocks A3 through E3 to the transparent processor 30b in the subsequent stage.

In the transparent processors 30b through 30e as well, the same processing as that in the transparent processor 30a is performed and the blocked A4 through E4 are output from the transparent processor 30e.

Thus, the data processor 1, on input of the blocks A1 through E1, outputs the blocks A4 through E4 where transparent data has been converted (restored) to original data, as shown in FIG. 3.

As mentioned earlier, the data processor 1 according to this embodiment converts high-speed serial data in the STM-16 to every 8-byte parallel data for transparent processing.

Thus, transparent data in the received data can be easily converted to original data (transparent processing) via a relatively low-speed general-purpose device. It is possible to flexibly support a variety of data speeds by changing as required the data width of parallel data depending on the speed of the received serial data.

The data processor 1 converts all the transparent data in the parallel data to original data by serially connecting transparent processors each processing a piece of transparent data in a piece of parallel data.

Thus, in case the data width of parallel data depending on the speed of received serial data, a variety of data speeds can be supported by changing the number of serially connected transparent processors.

The data processor 1 calculates in advance the information on data switching (number of switch bytes) required by the conversion of transparent data via the pointer controller 20, and sends the information to each transparent processor.

Thus, each transparent processor can switch data promptly thus allowing high-speed transparent processing on received data.

Received serial data can be converted to parallel data and processed based on the detected transparent data information according to the first and fifth aspects of the invention. This allows high-speed serial data to be applied transparent processing via a relatively low-speed device.

The position of transparent data contained in the converted parallel data is detected according to the second and the sixth aspects of the invention. It is possible to calculate the quantity of data to be moved in the movement controller and to convert the transparent data in the transparent processor.

All the transparent data can be easily processed by repeating the same processing (unit transparent processing) depending on the data width of parallel data according to the third and seventh aspect of the invention.

It is possible to realize a unit transparent processing via a simple processing according to the fourth and eighth aspects of the invention, thereby improving the efficiency of transparent processing.

What is claimed is:

1. A data processor used for high-speed serial data communications, comprising:

a data converter for receiving high-speed serial data and converting the data to parallel data of predetermined data width;

a transparent data information detector for detecting information on transparent data from the parallel data converted by said data converter;

a data movement controller for calculating the quantity of data to be moved from parallel data in the subsequent stage based on said transparent data information, said quantity of data decreased by conversion of said transparent data; and a transparent processor for converting transparent data in said parallel data based on said transparent data information and said quantity of data to be moved, moving predetermined data from parallel data in the subsequent stage, and rearranging the moved data into parallel data of predetermined width.

2. The data processor according to the claim 1, wherein said transparent data information detector comprises:

a transparent data detector for detecting the position of transparent data contained in the parallel data converted by said data converter; and a transparent information sender for sending the position of transparent data detected by said transparent data detector to said data movement controller and said transparent processor as said transparent data information.

3. The data processor according to claim 1, wherein said transparent processor comprises a plurality of unit transparent processors each of which converts one of said transparent data pieces contained in said parallel data single block to original data and moves predetermined data from the parallel data in the subsequent stage based on said quantity of data to be moved, and rearranges the moved data into parallel data of predetermined width.

4. The data processor according to claim 3, wherein said unit transparent processor comprises:

a transparent data converter for converting transparent data contained in said parallel data to original data; and a data movement section for moving predetermined data from the parallel data in the subsequent stage based on said quantity of data to be moved, and rearranges the moved data into parallel data of predetermined width.

5. A method of processing data associated with high-speed serial communications, said data method comprising:

a data converting step for receiving high-speed serial data and converting the data to parallel data of predetermined data width;

a transparent data information detecting step for detecting information on transparent data from the parallel data converted by said data converter;

a data calculating step for calculating the quantity of data to be moved from parallel data in the subsequent stage based on said transparent data information, said quantity of data decreased by conversion of said transparent data; and a transparent processing step for converting transparent data in said parallel data based on said transparent data information and said quantity of data to be moved, moving predetermined data from parallel data in the subsequent stage, and rearranging the moved data into parallel data of predetermined width.

6. The method according to the claim 5, wherein said detecting step comprises: a step for detecting the position of transparent data contained in said converted parallel data and a step for sending the position of said detected transparent data as said transparent data information.

7. The method according to claim 5, wherein said transparent processing step comprises a plurality of unit transparent processing steps each of which converts one of said transparent data pieces contained in said parallel data single block to original data and moves predetermined data from the parallel data in the subsequent stage based on said quantity of data to be moved, and rearranges the moved data into parallel data of predetermined width.

8. The method according to claim 7, wherein said unit processing step comprises:

a step for converting transparent data contained in said parallel data to original data; and a step for moving predetermined data from the data in the subsequent stage to the parallel data to which transparent data is converted, based on said calculated quantity of data to be moved.

* * * * *